United States Patent
Geshi et al.

(10) Patent No.: US 10,979,017 B2
(45) Date of Patent: Apr. 13, 2021

(54) LAYERED BODY AND SAW DEVICE

(71) Applicant: SUMITOMO ELECTRIC INDUSTRIES, LTD., Osaka (JP)

(72) Inventors: Keiichirou Geshi, Osaka (JP); Ryota Yamaguchi, Osaka (JP); Masato Hasegawa, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/495,139

(22) PCT Filed: Mar. 12, 2018

(86) PCT No.: PCT/JP2018/009453
§ 371 (c)(1),
(2) Date: Sep. 18, 2019

(87) PCT Pub. No.: WO2018/180418
PCT Pub. Date: Oct. 4, 2018

(65) Prior Publication Data
US 2020/0091891 A1 Mar. 19, 2020

(30) Foreign Application Priority Data

Mar. 27, 2017 (JP) .............................. JP2017-060774

(51) Int. Cl.
*H03H 9/08* (2006.01)
*H03H 3/08* (2006.01)
*H03H 9/02* (2006.01)
*H03H 9/64* (2006.01)

(52) U.S. Cl.
CPC ............... *H03H 9/08* (2013.01); *H03H 3/08* (2013.01); *H03H 9/02559* (2013.01); *H03H 9/64* (2013.01)

(58) Field of Classification Search
CPC ........ H03H 9/08; H03H 3/08; H03H 9/02559; H03H 9/64; H03H 9/02826; H03H 9/02834; H03H 9/02574
USPC ........................................ 333/133, 193–196
See application file for complete search history.

(56) References Cited

U.S. PATENT DOCUMENTS

2005/0194864 A1* 9/2005 Miura ................ H03H 9/02574
310/313 R

FOREIGN PATENT DOCUMENTS

| JP | 2004-343359 A | 12/2004 |
| JP | 2005-252550 A | 9/2005 |
| JP | 2011-66818 A | 3/2011 |

* cited by examiner

*Primary Examiner* — Robert J Pascal
*Assistant Examiner* — Jorge L Salazar, Jr.
(74) *Attorney, Agent, or Firm* — Faegre Drinker Biddle & Reath LLP (57) ABSTRACT

A layered body includes a ceramic substrate formed of a polycrystalline ceramic and having a supporting main surface and a piezoelectric substrate formed of a piezoelectric material and having a bonding main surface that bonds to the supporting main surface through Van der Waals force. The ceramic substrate includes a supporting main surface amorphous layer formed so as to include the supporting main surface. The piezoelectric substrate includes a bonding main surface amorphous layer formed so as to include the bonding main surface. The supporting main surface amorphous layer has a smaller thickness than the bonding main surface amorphous layer.

6 Claims, 5 Drawing Sheets

LAYERED BODY AND SAW DEVICE

TECHNICAL FIELD

The present invention relates to a layered body and a SAW device.

The present application claims the priority based on Japanese Patent Application No. 2017-060774 filed on Mar. 27, 2017, the entire contents of which are incorporated herein by reference.

BACKGROUND ART

SAW devices (surface acoustic wave devices) are installed in communication apparatuses such as cellular phones in order to remove noises included in electrical signals. SAW devices have a function of extracting only electrical signals having a desired frequency among input electrical signals. SAW devices have a structure in which electrodes are formed on a piezoelectric substrate. To dissipate heat during operation, the piezoelectric substrate is disposed on a base substrate formed of a material with good heat dissipation properties.

For example, a substrate formed of single-crystalline sapphire can be employed as the base substrate. However, if such a substrate formed of single-crystalline sapphire is employed as the base substrate, the production cost of SAW devices increases. To address this problem, there has been proposed a SAW device having a structure in which a ceramic substrate formed of polycrystalline spinel is employed as a base substrate, and a piezoelectric substrate and a ceramic substrate whose surface roughness Ra (arithmetic mean roughness) is decreased are bonded to each other through Van der Waals force. Thus, the production cost of SAW devices can be reduced (e.g., refer to PTL 1).

CITATION LIST

Patent Literature

PTL 1: Japanese Unexamined Patent Application Publication No. 2011-66818

SUMMARY OF INVENTION

A layered body according to the present disclosure includes a ceramic substrate formed of a polycrystalline ceramic and having a supporting main surface and a piezoelectric substrate formed of a piezoelectric material and having a bonding main surface that bonds to the supporting main surface through Van der Waals force. The ceramic substrate includes a supporting main surface amorphous layer formed so as to include the supporting main surface. The piezoelectric substrate includes a bonding main surface amorphous layer formed so as to include the bonding main surface. The supporting main surface amorphous layer has a smaller thickness than the bonding main surface amorphous layer.

DESCRIPTION OF EMBODIMENTS

Problems to be Solved by Present Disclosure

Layered bodies in the related art sometimes have insufficient bonding strength between the piezoelectric substrate and the ceramic substrate. Accordingly, it is an object of the present disclosure to provide a layered body in which a piezoelectric substrate and a ceramic substrate bond to each other with sufficient bonding strength and a SAW device including the layered body.

Advantageous Effects of Present Disclosure

The layered body according to the present disclosure can provide a layered body in which the piezoelectric substrate and the ceramic substrate bond to each other with sufficient bonding strength.

Description of Embodiments of the Present Invention

First, embodiments of the present invention will be listed and described. A layered body according to the present application includes a ceramic substrate formed of a polycrystalline ceramic and having a supporting main surface and a piezoelectric substrate formed of a piezoelectric material and having a bonding main surface that bonds to the supporting main surface through Van der Waals force. The ceramic substrate includes a supporting main surface amorphous layer formed so as to include the supporting main surface. The piezoelectric substrate includes a bonding main surface amorphous layer formed so as to include the bonding main surface. The supporting main surface amorphous layer has a smaller thickness than the bonding main surface amorphous layer.

In the layered body according to the present application, the supporting main surface of the ceramic substrate and the bonding main surface of the piezoelectric substrate bond to each other through Van der Waals force while an amorphous layer is formed on the ceramic substrate side so as to have a smaller thickness than that on the piezoelectric substrate side.

According to studies conducted by the present inventors, the bonding strength through Van der Waals force can be increased by decreasing the thickness of the amorphous layer formed in the ceramic substrate made of a polycrystalline material to a thickness smaller than that of an amorphous layer formed in the piezoelectric substrate made of a single-crystalline piezoelectric material. The reason for this is probably, for example, as follow. Many crystal faces having different plane orientations are exposed at the main surface of a ceramic substrate made of a polycrystalline material. The characteristics of crystal faces vary depending on their plane orientations. Therefore, if an amorphous layer having a larger thickness than that on the piezoelectric substrate side is formed on a main surface of the ceramic substrate, the characteristics in the main surface of the ceramic substrate considerably vary, which decreases the bonding strength with the piezoelectric substrate. By decreasing the thickness of the amorphous layer on the ceramic substrate side to a thickness smaller than that of the amorphous layer on the piezoelectric substrate side, the bonding strength through Van der Waals force can be improved. Thus, the layered body according to the present application can provide a layered body in which a piezoelectric substrate and a ceramic substrate bond to each other with sufficient bonding strength.

In the above layered body, the supporting main surface amorphous layer may have a thickness of 0.3 nm or more and 3.0 nm or less. When the supporting main surface amorphous layer has a thickness of 0.3 nm or more, the amorphous layer is easily formed at the supporting main surface in a uniform manner. When the supporting main surface amorphous layer has a thickness of 3.0 nm or less, the flatness of the supporting main surface is easily achieved. From the viewpoint of forming a uniform amorphous layer with more certainty, the supporting main surface amorphous layer preferably has a thickness of 0.5 nm or more. From the viewpoint of achieving the flatness of the supporting main surface with more certainty, the supporting main surface amorphous layer preferably has a thickness of 2.0 nm or less.

In the above layered body, the bonding main surface amorphous layer may have a thickness of 0.5 nm or more and 5.0 nm or less. When the bonding main surface amorphous layer has a thickness of 0.5 nm or more, the amorphous layer is easily formed at the bonding main surface in a uniform manner. When the bonding main surface amorphous layer has a thickness of 5.0 nm or less, the flatness of the bonding main surface is easily achieved. From the viewpoint of forming a uniform amorphous layer with more certainty, the bonding main surface amorphous layer preferably has a thickness of 1.2 nm or more. From the viewpoint of achieving the flatness of the bonding main surface with more certainty, the bonding main surface amorphous layer preferably has a thickness of 3.0 nm or less.

In the above layered body, the ceramic substrate may be formed of at least one material selected from the group consisting of spinel ($MgAl_2O_4$), alumina ($Al_2O_3$), magnesia (MgO), silica ($SiO_2$), mullite ($3Al_2O_3.2SiO_2$), cordierite ($2MgO.2Al_2O_3.5SiO_2$), calcia (CaO), titania ($TiO_2$), silicon nitride ($Si_3N_4$), aluminum nitride (AlN), and silicon carbide (SiC). These materials are suitable as materials for the ceramic substrate according to the present application.

In the above layered body, the piezoelectric substrate may be formed of lithium tantalate ($LiTaO_3$) or lithium niobate ($LiNbO_3$). These materials are suitable as materials for the piezoelectric substrate according to the present application.

A SAW device according to the present application includes the above layered body according to the present application and an electrode formed on a main surface of the piezoelectric substrate, the main surface being located opposite to the ceramic substrate.

The SAW device according to the present application includes the layered body according to the present application in which the piezoelectric substrate and the ceramic substrate formed of a polycrystalline ceramic bond to each other with sufficient bonding strength. This can provide a SAW device in which the piezoelectric substrate and the ceramic substrate bond to each other with sufficient bonding strength.

Details of Embodiments of Present Invention

Next, a layered body according to an embodiment of the present invention will be described with reference to the attached drawings. In the drawings, the same or corresponding parts are designated by the same reference numerals, and the description thereof is omitted.

Figure 1:
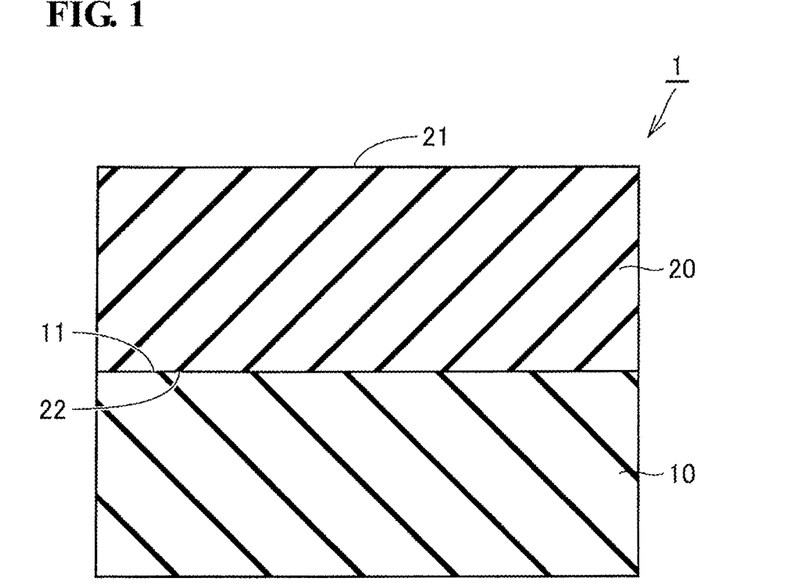
FIG. 1 is a schematic sectional view illustrating a structure of a layered body including a ceramic substrate and a piezoelectric substrate.

Referring to FIG. 1, a layered body 1 according to this embodiment includes a base substrate 10 serving as a ceramic substrate and a piezoelectric substrate 20. The piezoelectric substrate 20 is formed of a single-crystalline piezoelectric material such as single-crystalline lithium tantalate or single-crystalline lithium niobate. The base substrate 10 is formed of a polycrystalline ceramic made of at least one material selected from the group consisting of spinel, alumina, magnesia, silica, mullite, cordierite, calcia, titania, silicon nitride, aluminum nitride, and silicon carbide and is preferably formed of a polycrystalline ceramic made of any one of the foregoing materials.

The base substrate 10 has a supporting main surface 11. The piezoelectric substrate 20 has an exposed main surface 21 that is one main surface and a bonding main surface 22 that is a main surface opposite to the exposed main surface 21. The piezoelectric substrate 20 is disposed on the supporting main surface 11 of the base substrate 10 so that the bonding main surface 22 is in contact with the supporting main surface 11. The base substrate 10 and the piezoelectric substrate 20 are bonded to each other through Van der Waals force.

Figure 2:
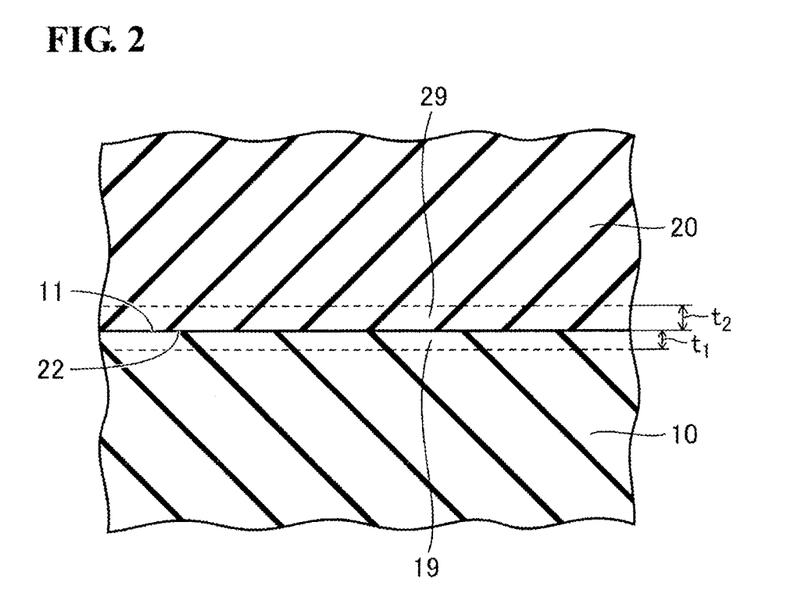
FIG. 2 is a schematic sectional view illustrating a structure near an interface between the ceramic substrate and the piezoelectric substrate.

Referring to FIG. 2, the base substrate 10 includes a supporting main surface amorphous layer 19 formed so as to include the supporting main surface 11. The piezoelectric substrate 20 includes a bonding main surface amorphous layer 29 formed so as to include the bonding main surface 22. The thickness $t_1$ of the supporting main surface amorphous layer 19 is smaller than the thickness $t_2$ of the bonding main surface amorphous layer 29.

In the layered body 1, the thickness $t_1$ of the supporting main surface amorphous layer 19 that is an amorphous layer in the base substrate 10 is smaller than the thickness $t_2$ of the bonding main surface amorphous layer 29 that is an amorphous layer in the piezoelectric substrate 20. As a result, the layered body 1 has an improved bonding strength between the base substrate 10 and the piezoelectric substrate 20 through Van der Waals force.

The thickness $t_1$ of the supporting main surface amorphous layer 19 is preferably 0.3 nm or more and 3.0 nm or less. When the supporting main surface amorphous layer 19 has a thickness $t_1$ of 0.3 nm or more, the amorphous layer is easily formed at the supporting main surface 11 in a uniform manner. When the supporting main surface amorphous layer 19 has a thickness $t_1$ of 3.0 nm or less, the flatness of the supporting main surface 11 is easily achieved.

The thickness $t_2$ of the bonding main surface amorphous layer 29 is preferably 0.5 nm or more and 5.0 nm or less. When the bonding main surface amorphous layer 29 has a thickness $t_2$ of 0.5 nm or more, the amorphous layer is easily formed at the bonding main surface 22 in a uniform manner. When the bonding main surface amorphous layer 29 has a thickness $t_2$ of 5.0 nm or less, the flatness of the bonding main surface 22 is easily achieved.

Figure 3:
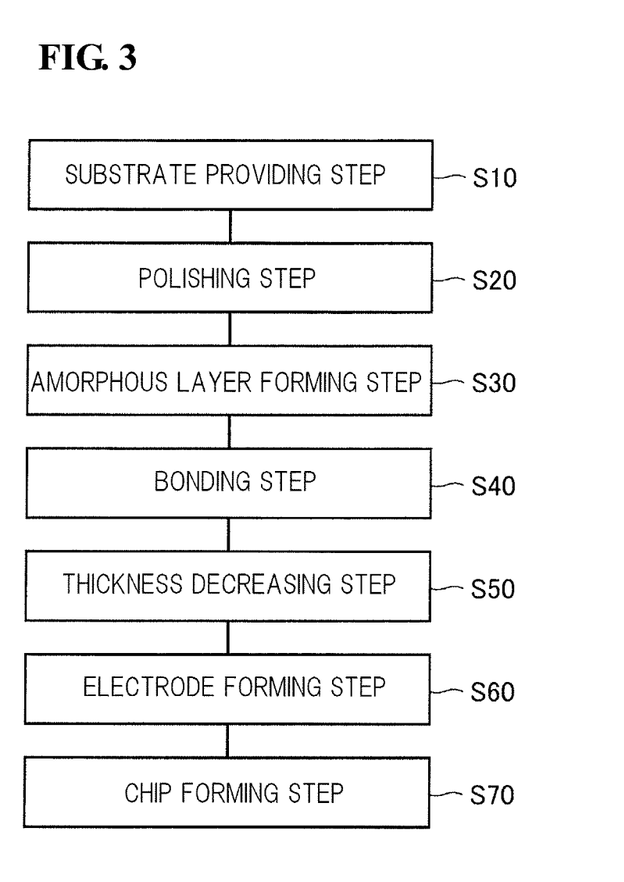
FIG. 3 is a flowchart schematically illustrating a method for producing a layered body and a SAW device.

Next, a method for producing a layered body 1 and a SAW device including the layered body 1 according to this embodiment will be described. Referring to FIG. 3, the method for producing a layered body 1 and a SAW device according to this embodiment includes a substrate providing step performed first as a step (S10). In the step (S10), referring to FIG. 4, a base substrate 10 formed of a polycrystalline ceramic made of at least one material selected from the group consisting of spinel, alumina, magnesia, silica, mullite, cordierite, calcia, titania, silicon nitride, aluminum nitride, and silicon carbide is provided. For example, a base substrate 10 formed of a polycrystalline ceramic made of one material selected from the above group is provided. Specifically, for example, when a base substrate 10 formed of polycrystalline spinel is provided, a raw material powder is prepared by mixing magnesia powder and alumina powder, and a molded body is produced by molding the raw material powder. The molded body can be produced by, for example, performing preforming by press molding and then performing CIP (cold isostatic pressing). Subsequently, the molded body is subjected to sintering treatment. The sintering treatment can be performed by a method such as vacuum sintering or HIP (hot isostatic pressing). Thus, a sintered body formed of polycrystalline spinel is obtained. The sintered body is then subjected to dicing to obtain a base substrate 10 having a desired shape (thickness) (refer to FIG. 4).

Figure 4:
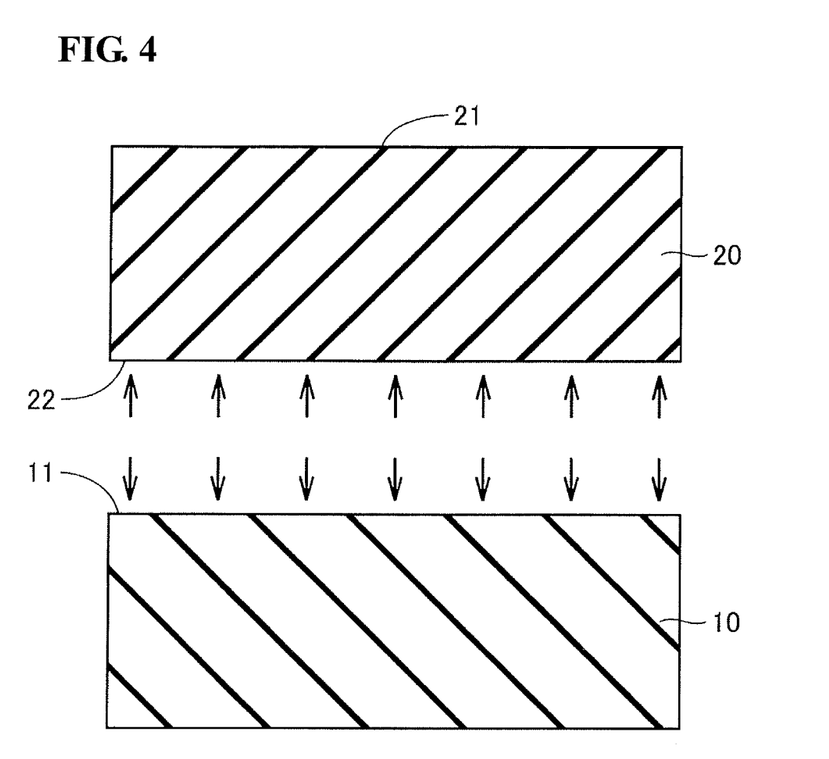
FIG. 4 is a schematic sectional view for describing the method for producing a layered body and a SAW device.

In the step (S10), referring to FIG. 4, a piezoelectric substrate 20 formed of a single-crystalline piezoelectric material such as single-crystalline lithium tantalate or single-crystalline lithium niobate is also provided. The piezoelectric substrate 20 is provided by, for example, slicing a single crystal of lithium tantalate or lithium niobate (refer to FIG. 4).

Subsequently, a polishing step is performed as a step (S20). In the step (S20), referring to FIG. 4, polishing treatment is performed on the supporting main surface 11 of the base substrate 10 provided in the step (S10) and on the bonding main surface 22 of the piezoelectric substrate 20 provided in the step (S10). The polishing treatment includes, for example, rough polishing, normal polishing, and finishing polishing.

Subsequently, an amorphous layer forming step is performed as a step (S30). In the step (S30), a supporting main surface amorphous layer 19 and a bonding main surface amorphous layer 29 are respectively formed in the base substrate 10 and the piezoelectric substrate 20 that have been subjected to the polishing treatment in the step (S20). Specifically, referring to FIG. 4, for example, the base substrate 10 and the piezoelectric substrate 20 are washed, dried, and then inserted into a chamber, and the pressure in the chamber is reduced. The pressure in the chamber is set to, for example, about $10^{-6}$ Pa. As indicated by arrows in FIG. 4, the supporting main surface 11 and the bonding main surface 22 are irradiated with, for example, Ar (argon) beams. This disturbs the atomic arrangements near the supporting main surface 11 and the bonding main surface 22. Thus, a supporting main surface amorphous layer 19 and a bonding main surface amorphous layer 29 are formed. In this embodiment, the irradiation with Ar beams is performed so that the thickness $t_1$ of the supporting main surface amorphous layer 19 is smaller than the thickness $t_2$ of the bonding main surface amorphous layer 29.

Subsequently, a bonding step is performed as a step (S40). In the step (S40), the base substrate 10 and the piezoelectric substrate 20 each having a main surface at which the amorphous layer has been formed in the step (S30) are bonded to each other. Specifically, referring to FIG. 4 and FIG. 1, the base substrate 10 and the piezoelectric substrate 20 are bonded to each other so that the bonding main surface 22 of the piezoelectric substrate 20 is in contact with the supporting main surface 11 of the base substrate 10. Thus, the base substrate 10 and the piezoelectric substrate 20 bond to each other through Van der Waals force. Consequently, a layered body 1 according to this embodiment is obtained.

In this embodiment, the thickness $t_1$ of the supporting main surface amorphous layer 19 is smaller than the thickness $t_2$ of the bonding main surface amorphous layer 29. Consequently, according to the method for producing a layered body 1, a layered body 1 is produced in which the piezoelectric substrate 20 and the base substrate 10 bond to each other with sufficient bonding strength.

Figure 5:
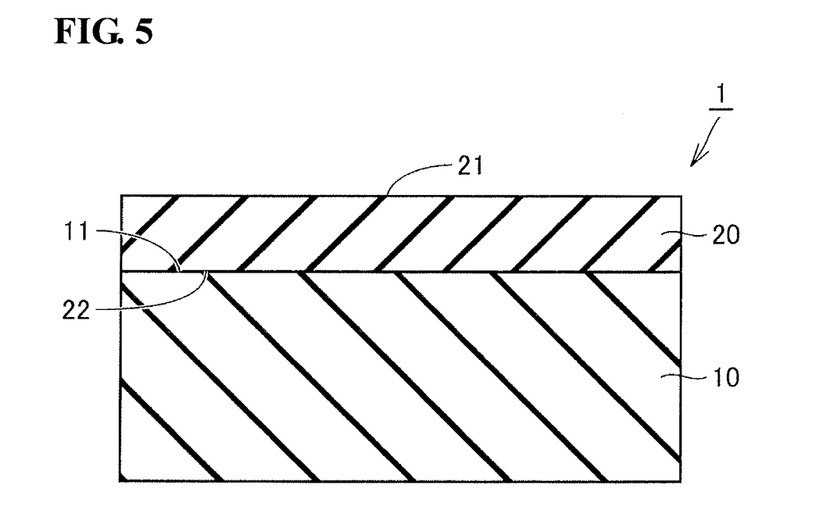
FIG. 5 is a schematic sectional view for describing the method for producing a layered body and a SAW device.

Next, a method for producing a SAW device including the layered body 1 will be described. Referring to FIG. 3, after the step (S40), a thickness decreasing step is performed as a step (S50). In the step (S50), referring to FIG. 1 and FIG. 5, the thickness of the piezoelectric substrate 20 of the layered body 1 obtained in the step (S40) is decreased. Specifically, for example, an exposed main surface 21 of the piezoelectric substrate 20 is subjected to grinding treatment. Thus, the thickness of the piezoelectric substrate 20 is decreased to a thickness appropriate for SAW devices.

Figure 6:
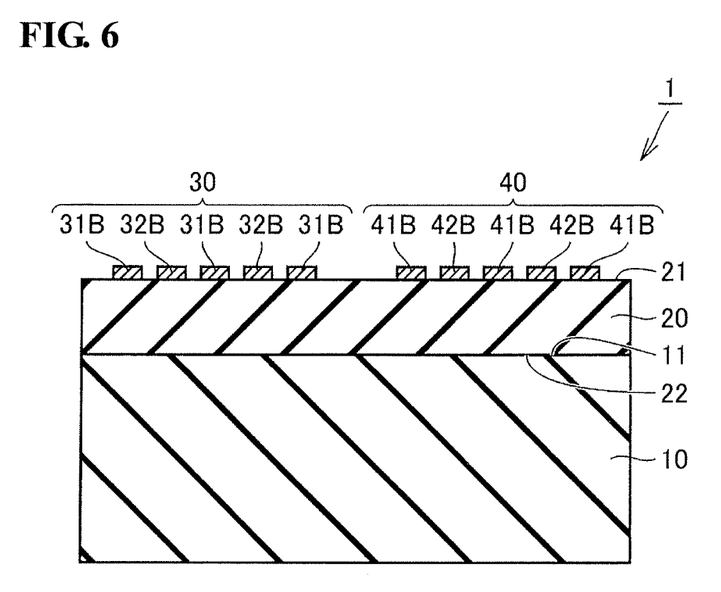
FIG. 6 is a schematic sectional view for describing the method for producing a layered body and a SAW device.
Figure 7:
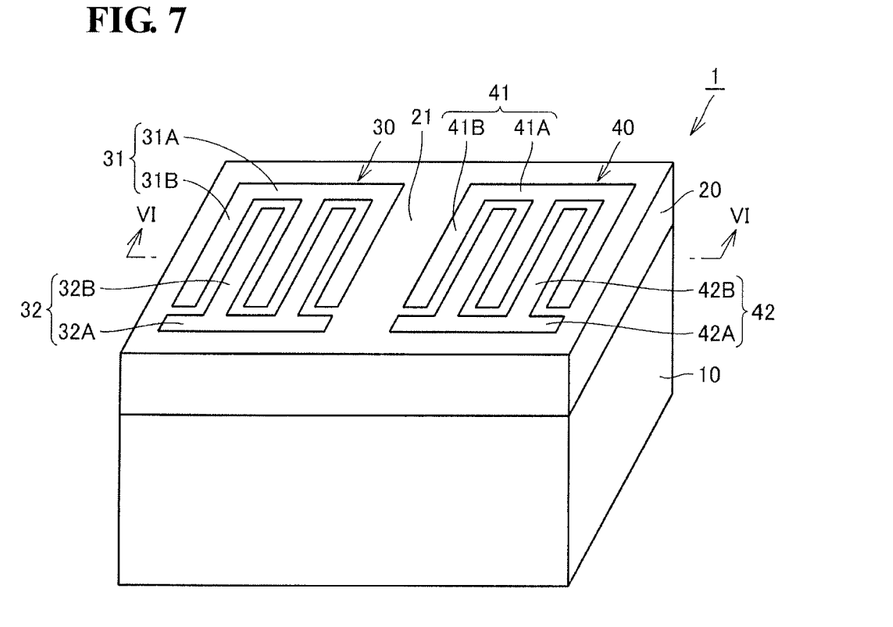
FIG. 7 is a schematic view for describing the method for producing a layered body and a SAW device.

Subsequently, an electrode forming step is performed as a step (S60). In the step (S60), referring to FIG. 5 to FIG. 7, comb-shaped electrodes are formed on the exposed main surface 21 of the piezoelectric substrate 20. FIG. 6 is a sectional view taken along line VI-VI in FIG. 7. Specifically, referring to FIG. 6 and FIG. 7, a conductive film made of an electric conductor such as Al is formed on the exposed main surface 21 of the piezoelectric substrate 20 whose thickness has been appropriately adjusted in the step (S50). The conductive film can be formed by, for example, a sputtering method. A resist is then applied onto the conductive film to form a resist film. By performing exposure and development, an opening is formed in a region other than regions corresponding to desired shapes of an input-side electrode 30 and an output-side electrode 40. For example, wet etching is performed using the resist film having the opening formed therein as a mask to form a plurality of pairs of input-side electrodes 30 and output-side electrodes 40 as illustrated in FIG. 6 and FIG. 7. FIG. 6 and FIG. 7 illustrate a region corresponding to a pair of input-side electrode 30 and output-side electrode 40. The electrode interval of the comb-shaped electrode in the input-side electrode 30 and the output-side electrode 40 can be appropriately determined in accordance with the frequency of signals to be output.

Subsequently, a chip forming step is performed as a step (S70). In the step (S70), the layered body 1 on which a plurality of pairs of input-side electrodes 30 and output-side electrodes 40 have been formed is cut in a thickness direction into a plurality of chips each including a pair of input-side electrode 30 and output-side electrode 40.

Figure 8:
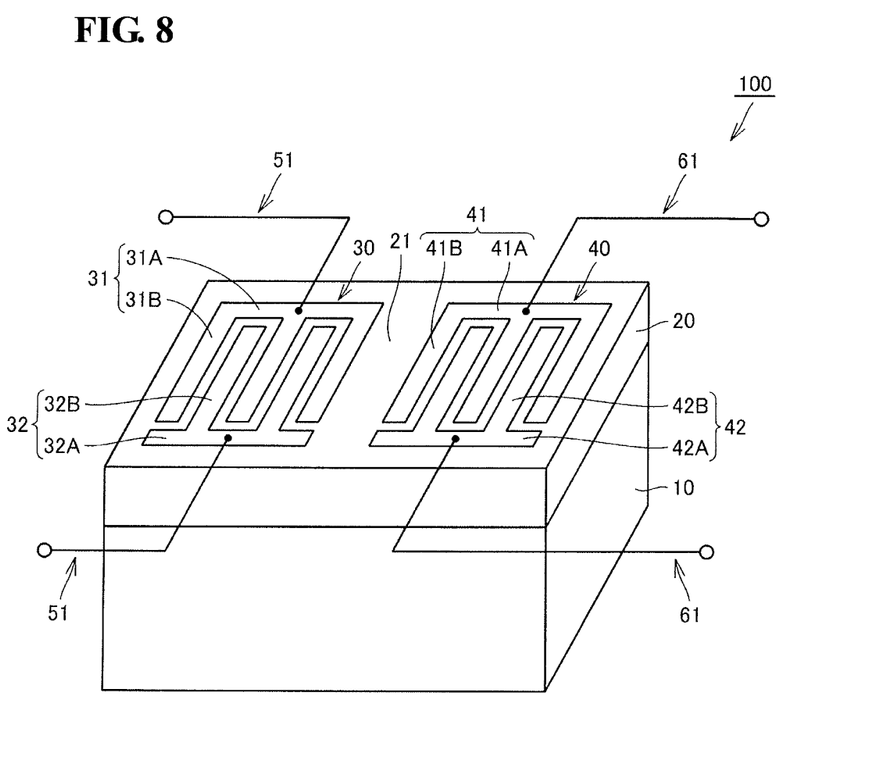
FIG. 8 is a schematic view illustrating a structure of a SAW device.

Referring to FIG. 7 and FIG. 8, an input-side wiring line 51 and an output-side wiring line 61 are then formed on the chip produced in the step (S70) to complete a SAW device 100 (SAW filter) according to this embodiment.

Referring to FIG. 8, the SAW device 100 according to this embodiment includes the layered body 1 including the base substrate 10 and the piezoelectric substrate 20 that bond to each other through Van der Waals force, the input-side electrode 30 and the output-side electrode 40, which are a pair of comb-shaped electrodes formed so as to be in contact with the exposed main surface 21 of the piezoelectric substrate 20, the input-side wiring line 51 connected to the input-side electrode 30, and the output-side wiring line 61 connected to the output-side electrode 40.

The input-side electrode 30 includes a first portion 31 and a second portion 32. The first portion 31 includes a linear base 31A and a plurality of linear protrusions 31B that protrude from the base 31A in a direction perpendicular to the direction in which the base 31A extends. The second portion 32 includes a linear base 32A that extends in parallel with the base 31A and a plurality of linear protrusions 32B that protrude from the base 32A in a direction perpendicular to the direction in which the base 32A extends and that fit into gaps between adjacent protrusions 31B. The protrusions 31B and the protrusions 32B are disposed at predetermined evenly spaced intervals.

The output-side electrode 40 includes a first portion 41 and a second portion 42. The first portion 41 includes a linear base 41A and a plurality of linear protrusions 41B that protrude from the base 41A in a direction perpendicular to the direction in which the base 41A extends. The second portion 42 includes a linear base 42A that extends in parallel with the base 41A and a plurality of linear protrusions 42B that protrude from the base 42A in a direction perpendicular to the direction in which the base 42A extends and that fit into gaps between adjacent protrusions 41B. The protrusions 41B and the protrusions 42B are disposed at predetermined evenly spaced intervals.

When an AC voltage serving as an input signal is applied to the input-side electrode 30 through the input-side wiring line 51, a surface acoustic wave is generated on the exposed main surface 21 (surface) of the piezoelectric substrate 20 because of a piezoelectric effect, and the surface acoustic wave propagates to the output-side electrode 40. Herein, the input-side electrode 30 and the output-side electrode 40 have a comb shape as illustrated in FIG. 8, and the protrusions 31B and the protrusions 32B are evenly spaced and the protrusions 41B and the protrusions 42B are evenly spaced. Thus, in a direction from the input-side electrode 30 toward the output-side electrode 40, regions in which electrodes are formed on the exposed main surface 21 of the piezoelectric substrate 20 are present at a predetermined period (electrode period). Therefore, the surface acoustic wave generated by the input signal is excited most when its wavelength is coincident with the electrode period, and is attenuated as the difference between the wavelength and the electrode period increases. Consequently, only a signal with a wavelength close to the electrode period is output through the output-side electrode 40 and the output-side wiring line 61.

In the above operation, the temperature of the piezoelectric substrate 20 increases. In the SAW device 100 according to this embodiment, the piezoelectric substrate 20 is disposed so as to be in contact with the base substrate 10, which is made of a material having good heat dissipation properties. Therefore, the SAW device 100 has high reliability. Furthermore, in the SAW device 100 according to this embodiment, the piezoelectric substrate 20 and the base substrate 10 bond to each other with sufficient bonding strength. Accordingly, the SAW device 100 is a highly reliable device.

EXAMPLES

The steps (S10) to (S40) according to the above embodiment were performed to produce a layered body 1, and an experiment was performed to check the bonding strength between the base substrate 10 (ceramic substrate) and the piezoelectric substrate 20. Specifically, the base substrate 10 formed of polycrystalline spinel and the piezoelectric substrate 20 formed of single-crystalline lithium tantalate were provided in the step (S10), and, the steps (S20) to (S40) were performed to produce a layered body 1. Two types of layered bodies 1 were produced by differentiating the irradiation conditions of Ar beams in the step (S30) (sample A and sample B).

For each of the sample A and the sample B, the bonding strength between the base substrate 10 and the piezoelectric substrate 20 was checked by a crack opening method. Furthermore, for each of the sample A and the sample B, the layered body 1 was cut in a thickness direction of the substrates and a portion near the bonding interface was observed with a STEM (scanning transmission electron microscope) to measure the thicknesses of the supporting main surface amorphous layer 19 and the bonding main surface amorphous layer 29. The thicknesses of the supporting main surface amorphous layer 19 and the bonding main surface amorphous layer 29 were measured in five fields of view for each of the sample A and the sample B. Table 1 and Table 2 show the experimental results.

TABLE 1

|  | Field of view 1 | Field of view 2 | Field of view 3 | Field of view 4 | Field of view 5 |
| --- | --- | --- | --- | --- | --- |
| Supporting main surface amorphous layer (ceramic substrate side) | 1.1 nm | 1.0 nm | 0.7 nm | 0.7 nm | 1.1 nm |
| Bonding main surface amorphous layer (piezoelectric substrate side) | 2.6 nm | 2.0 nm | 2.4 nm | 2.3 nm | 2.3 nm |

TABLE 2

|  | Field of view 1 | Field of view 2 | Field of view 3 | Field of view 4 | Field of view 5 |
| --- | --- | --- | --- | --- | --- |
| Supporting main surface amorphous layer (ceramic substrate side) | 0.6 nm | 0.5 nm | 0.7 nm | 0.7 nm | 0.8 nm |
| Bonding main surface amorphous layer (piezoelectric substrate side) | 2.0 nm | 2.2 nm | 2.3 nm | 2.3 nm | 1.9 nm |

Table 1 and Table 2 show the experimental results for the sample A and the sample B, respectively. Referring to Table 1 and Table 2, the thickness of the supporting main surface amorphous layer 19 was smaller than that of the bonding main surface amorphous layer 29 in each of the sample A and the sample B. More specifically, the thickness of the supporting main surface amorphous layer 19 was less than or equal to ½ the thickness of the bonding main surface amorphous layer 29. For each of the sample A and the sample B, the supporting main surface amorphous layer had a thickness of 0.3 nm or more and 3.0 nm or less and the bonding main surface amorphous layer had a thickness of 0.5 nm or more and 5.0 nm or less. The investigation of the bonding strength showed that both the sample A and the sample B had sufficient bonding strength. On the other hand, sufficient bonding strength was not achieved in a separately produced sample in which the supporting main surface amorphous layer 19 had a larger thickness than the bonding main surface amorphous layer 29. The above experimental results show that the layered body according to the present application can provide a layered body in which the piezoelectric substrate and the ceramic substrate (base substrate) bond to each other with sufficient bonding strength.

The embodiment and Example disclosed herein are mere examples in all respects and should be understood as being non-limitative in any perspective. The scope of the present invention is defined not by the above description but by Claims. The scope of the present invention is intended to embrace all the modifications within the meaning and range of equivalency of the Claims.

The invention claimed is:

1. A layered body comprising:
    a ceramic substrate formed of a polycrystalline ceramic and having a supporting main surface; and
    a piezoelectric substrate formed of a piezoelectric material and having a bonding main surface that bonds to the supporting main surface of the ceramic substrate through Van der Waals force,
    wherein the ceramic substrate includes a supporting main surface amorphous layer formed so as to include the supporting main surface,
    the piezoelectric substrate includes a bonding main surface amorphous layer formed so as to include the bonding main surface, and
    the supporting main surface amorphous layer has a smaller thickness than the bonding main surface amorphous layer.

2. The layered body according to claim 1, wherein the supporting main surface amorphous layer has a thickness in a range equal to or larger than 0.3 nm and equal to or smaller than 3.0 nm.

3. The layered body according to claim 1, wherein the bonding main surface amorphous layer has a thickness in a range equal to or larger than 0.5 nm and equal to or smaller than 5.0 nm.

4. The layered body according to claim 1, wherein the ceramic substrate is formed of at least one material selected from the group consisting of spinel, alumina, magnesia, silica, mullite, cordierite, calcia, titania, silicon nitride, aluminum nitride, and silicon carbide.

5. The layered body according to claim 1, wherein the piezoelectric substrate is formed of lithium tantalate or lithium niobate.

6. A SAW device comprising:
    the layered body according to claim 1; and
    an electrode formed on a main surface of the piezoelectric substrate, the main surface being located opposite to the ceramic substrate.

* * * * *